United States Patent
Miyasaka et al.

(10) Patent No.: US 6,291,856 B1
(45) Date of Patent: Sep. 18, 2001

(54) SEMICONDUCTOR DEVICE WITH ALTERNATING CONDUCTIVITY TYPE LAYER AND METHOD OF MANUFACTURING THE SAME

(75) Inventors: Yasushi Miyasaka; Tatsuhiko Fujihira; Yasuhiko Ohnishi; Katsunori Ueno; Susumu Iwamoto, all of Nagano (JP)

(73) Assignee: Fuji Electric Co., Ltd. (JP)

(*) Notice: Subject to any disclaimer, the term of this patent is extended or adjusted under 35 U.S.C. 154(b) by 0 days.

(21) Appl. No.: 09/438,078

(22) Filed: Nov. 10, 1999

(30) Foreign Application Priority Data

Nov. 12, 1998 (JP) .................................. 10-321567
Aug. 5, 1999 (JP) .................................. 11-221861

(51) Int. Cl.[7] ............................ H01L 29/76; H01L 29/94; H01L 31/062; H01L 31/113; H01L 31/119
(52) U.S. Cl. ........................... 257/335; 257/341; 257/342
(58) Field of Search ..................... 257/335, 336, 257/337, 341, 342

(56) References Cited

U.S. PATENT DOCUMENTS

| | | | |
|---|---|---|---|
| 5,216,275 | 6/1993 | Chen | 257/493 |
| 5,438,215 | 8/1995 | Tihanyi | 257/401 |
| 6,081,009 | * 7/2000 | Neilson | 257/341 |
| 6,097,063 | * 8/2000 | Fujihira | 257/339 |
| 6,184,555 | * 2/2001 | Tihanyi et al. | 257/342 |

FOREIGN PATENT DOCUMENTS 0053854    2/1986  (EP) .

OTHER PUBLICATIONS

Tatsuhiko Fujihira, "Theory of Semiconductor Superjunction Devices", Oct. 1997, pp. 6254–6262, Jpn. J. Appl. Phys. vol. 36 (1997), Part 1, No. 10.

* cited by examiner

*Primary Examiner*—Ngân V. Ngô
(74) *Attorney, Agent, or Firm*—Rossi & Associates

(57) ABSTRACT

This invention clarifies the effects of parameters and enables the mass production of a super-junction semiconductor device, which has a drift layer composed of a parallel pn layer that conducts electricity in the ON state and is depleted in the OFF state. The quantity of impurities in n drift regions is within the range between 100% and 150% or between 110% and 150% of the quantity of impurities in p partition regions. The impurity density of either one of the n drift regions and the p partition regions is within the range between 92% and 108% of the impurity density of the other regions. In addition, the width of either one of the n drift regions and the p partition regions is within the range between 94% and 106% of the width of the other regions.

6 Claims, 5 Drawing Sheets

SEMICONDUCTOR DEVICE WITH ALTERNATING CONDUCTIVITY TYPE LAYER AND METHOD OF MANUFACTURING THE SAME

FIELD OF THE INVENTION

The present invention relates to a semiconductor device, such as an insulated gate metal oxide semiconductor field-effect transistor (MOSFET), an insulated gate bipolar transistor (IGBT), a bipolar transistor and a diode, which has a parallel pn layer that conducts electricity in the ON state and is depleted in the OFF state.

BACKGROUND OF THE INVENTION

A high-resistance layer between two electrodes provided on opposite two principal faces must be thick in order to achieve the high withstand voltage in a longitudinal semiconductor device, in which an electric current flows between the two electrodes. A device having the thick high-resistance layer provides high ON-state resistance between the two electrodes, and thus, the loss is unavoidably increased. In short, there is a trade-off relationship between the ON-state resistance (the current-carrying capacity) and the withstand voltage. As is well known, the trade-off relationship applies to a variety of semiconductor devices such as an IGBT, a bipolar transistor and a diode. The problem also applies to a lateral semiconductor device in that a direction in which a drift current flows in the ON state is different from a direction in which a depletion layer spreads due to the reverse bias in the OFF state.

To address the above-mentioned problem, European Patent No. 0,053,854, U.S. Pat. No. 5,216,275, U.S. Pat. No. 5,438,215, and Japanese Patent Provisional Publication No. 9-266311 developed by the inventors of this invention have disclosed a semiconductor device having a drift layer composed of a parallel pn layer, in which n regions and p regions with high impurity density are alternately piled up. In this semiconductor device, the parallel pn layer is depleted in the OFF state to burden the withstand voltage.

In the following description, a semiconductor device having a drift layer composed of a parallel pn layer, which conducts electricity in the ON state and is depleted in the OFF state, will be referred to as a super-junction semiconductor device.

The above-mentioned conventional semiconductor device is in an experimental stage, and it is still impossible to manufacture the devices in large quantities. For example, the impurity density and width of the parallel pn layer need to be uniform, but actually, the impurity density and the width are always uneven in the manufacturing process.

Moreover, no specific numerical value has been specified with respect to an L load avalanche breakdown current, which is an important factor in the manufacture of the devices. The L load avalanche breakdown current is preferably more than a rated current in order to manufacture the devices.

SUMMARY OF THE INVENTION

In view of the foregoing, it is an object of the present invention to provide a super-junction semiconductor device, which significantly improves the trade-off relation between the ON-resistance and the withstand voltage, achieves a high withstand voltage by specifying the allowable range of the impurity density, width, or the like and is suitable for the mass production.

To achieve the above-mentioned object, the present invention is directed to a super-junction semiconductor device, which comprises first and second principal faces, two principal electrodes provided on the principal faces, and a parallel pn layer, in which first-conductivity-type drift regions and second-conductivity-type partition regions are arranged alternately, the parallel pn layer being provided between the two principal electrodes and conducting electricity in the ON state and being depleted in the OFF state, wherein the quantity of impurities in the first-conductivity-type drift regions is within the range between 100% and 150% of the quantity of impurities in the second-conductivity-type partition regions.

Particularly, the quantity of impurities in the first-conductivity-type drift regions is preferably between 110% and 150% of the quantity of impurities in the second-conductivity-type partition regions.

The first-conductivity-type drift regions and the second-conductivity-type partition regions are preferably arranged in stripes with the same width.

The present invention is also directed to a super-junction semiconductor device, which comprises first and second principal faces, two principal electrodes provided on the principal faces, and a parallel pn layer, in which first-conductivity-type drift regions and second-conductivity-type partition regions are arranged alternately, the parallel pn layer being provided between the two principal electrodes and conducting electricity in the ON state and being depleted in the OFF state, wherein the first-conductivity-type drift regions and the second-conductivity-type partition regions have almost the same width and are arranged in stripes, and the quantity of impurities in either one of the first-conductivity-type drift regions and the second-conductivity-type partition regions is within the range between 92% and 108% of the quantity of impurities in the other regions.

Particularly, the average impurity density of either one of the conductive drift regions and the second-conductivity-type partition regions may be within the range between 92% and 108% of the average impurity density of the other regions. The impurity density of either one of the conductive drift regions and the second-conductivity-type partition regions may be within the range between 92% and 108% of the impurity density of the other regions.

The width of either one of the conductive drift regions and the second-conductivity-type partition regions is within the range between 94% and 106% of the width of the other regions.

The first-conductivity-type drift regions and the second-conductivity-type partition regions have substantially the same quantity of impurities in order to deplete the parallel pn layer, in which the first-conductivity-type drift regions and the second-conductivity-type partition regions are arranged alternately, in the OFF state. If the impurity density of either one of the first-conductivity-type drift regions and the second-conductivity-type partition regions is half the impurity density in the other regions, the one regions must be twice as wide as the other regions. Therefore, if the first-conductivity-type drift regions and the second-conductivity-type partition regions have the same impurity density, they can be formed in the same width. This is preferable in order to utilize the surface of the semiconductor efficiently.

The first-conductivity-type drift regions and the second-conductivity-type partition regions with the same impurity density and width can be depleted almost uniformly. This keeps the decrease in the withstand voltage, which results from the incomplete depletion, at about 10%.

In order to manufacture the super-junction semiconductor device, either one of the conductive drift regions and the second-conductivity-type partition regions with the impurities in the quantity within the range between 92% and 108% of the quantity of impurities in the other regions may be formed by an epitaxial growth. Alternatively, the impurities in quantity within the range between 92% and 108% of the quantity of impurities required for forming either one of the first-conductivity-type drift regions and the second-conductivity-type partition regions are implanted, and the other regions are then formed by thermal diffusion.

BRIEF DESCRIPTION OF THE DRAWINGS

The nature of this invention, as well as other objects and advantages thereof, will be explained in the following with reference to the accompanying drawings, in which like reference characters designate the same or similar parts throughout the figures and wherein.

DETAILED DESCRIPTION OF THE PREFERRED EMBODIMENTS

A description will hereunder be given of the experiments conducted for developing the present invention and the results of the experiments.

Figure 3:
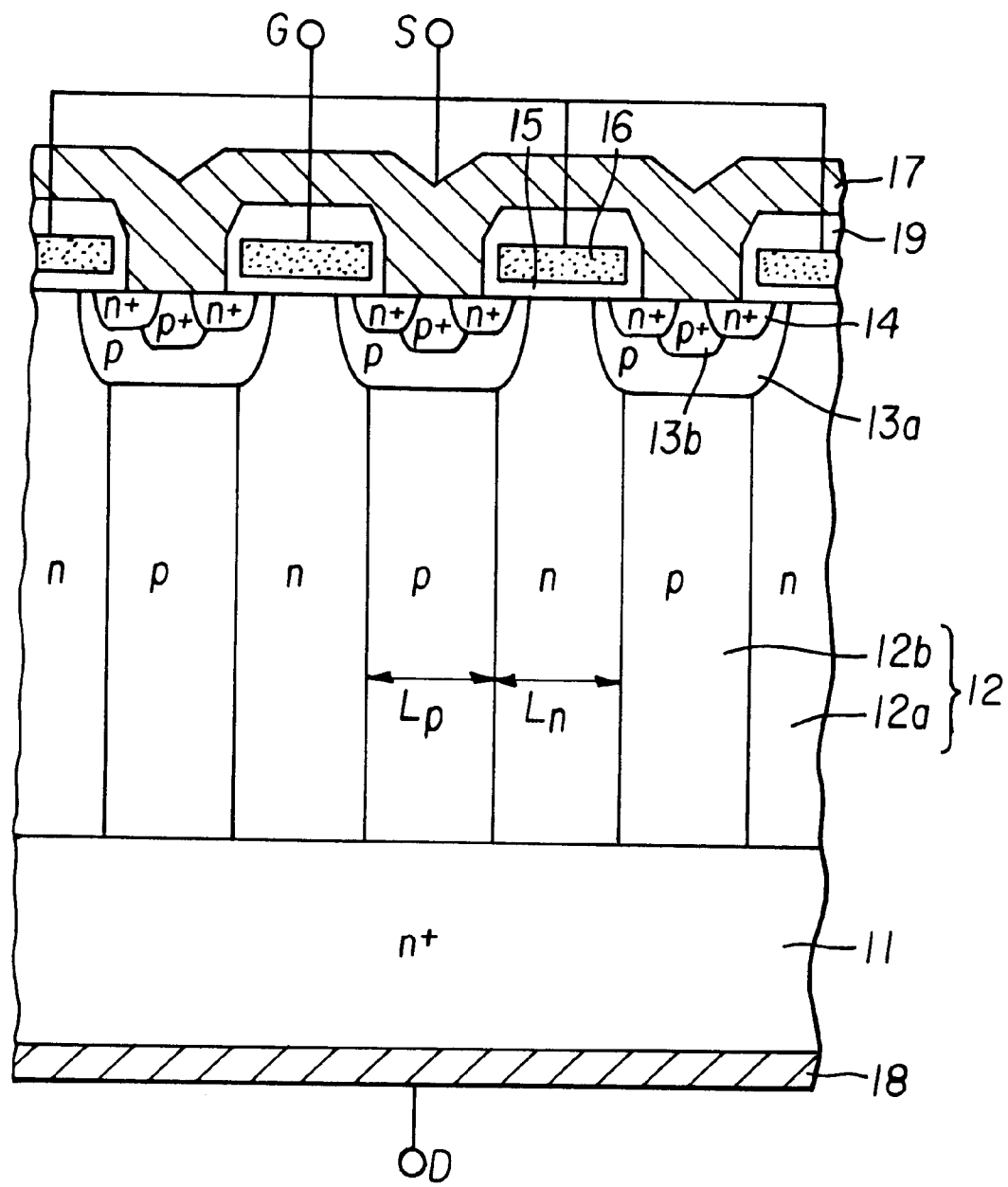
FIG. 3 is a partial sectional view showing the essential parts of a super-junction MOSFET according to the first embodiment.

FIG. 3 is a partial sectional view showing the fundamental structure of a longitudinal n-channel type super-junction MOSFET used in the experiments in accordance with a first embodiment of the invention. Additionally, a part for maintaining a withstand voltage is formed at the peripheral edge of the MOSFET, and this part is, for example, formed by an ordinary structure like a guard ring structure. In the following description, n or p prefixed to regions and layers mean that majority carriers in these regions and layers are electrons and holes, respectively. A prefix + means a relatively-high impurity density, and a prefix − means a relatively-low impurity density.

Figure 1:
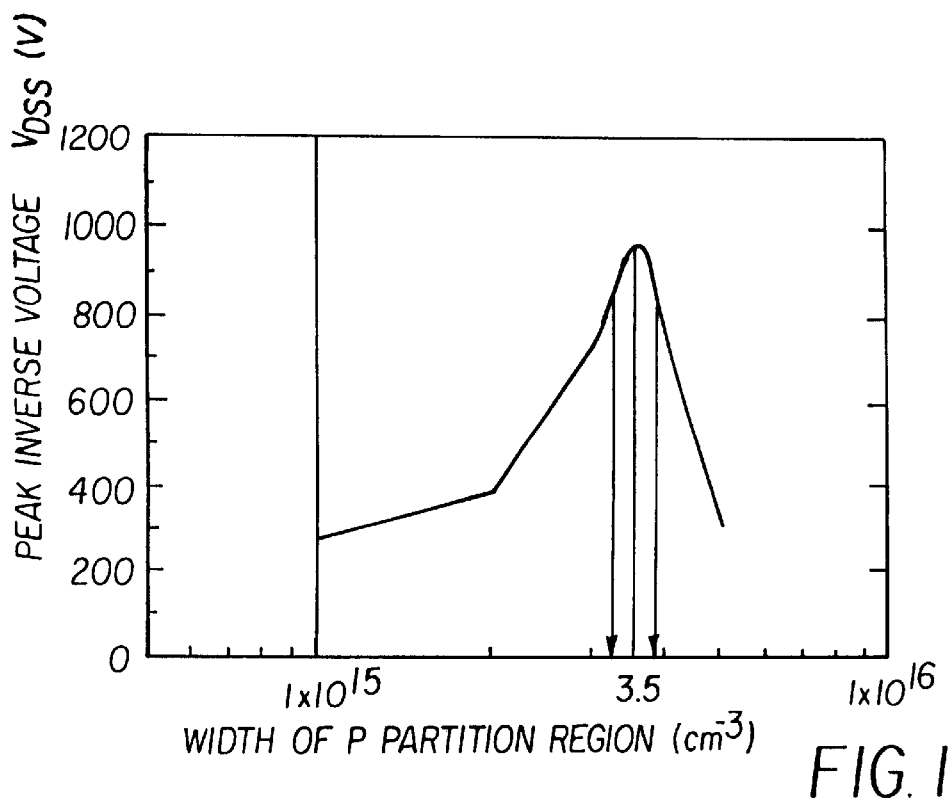
FIG. 1 is a characteristic drawing showing the dependency of the withstand voltage ($V_{DSS}$) on the width Lp in a super-junction MOSFET according to the present invention.
Figure 2:
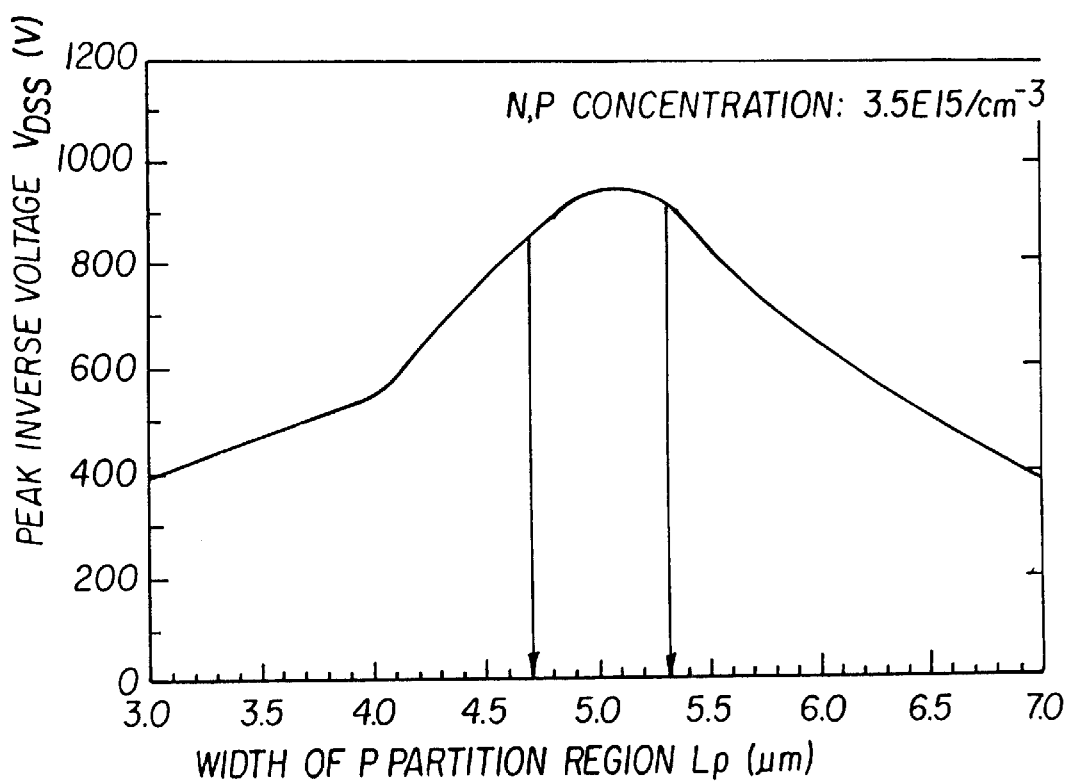
FIG. 2 is a characteristic drawing showing the dependency of the withstand voltage ($V_{DSS}$) on the impurity density Cp.

In FIG. 3, reference numeral 11 denotes a low-resistance n+ drain layer, and 12 is a drift layer of a parallel pn layer, which is composed of n drift regions 12a and p partition regions 12B. An electric current is only passed through the n drift regions 12a of the n drift layer 12, but the parallel pn layer including the p partition regions 12b will hereafter be called the drift layer 12. On a surface layer, n-channel regions are connected to the n drift regions 12a, and p-well regions 13a are connected to the p partition regions 12b. In addition, n+ source regions 14 and high-density contact regions 13b are formed inside the p well regions 13a. Gate electrode layers 16 of polycrystalline silicon are formed on the surface of the p well regions 13a between the n+ source regions 14 and the n drift regions 12b through a gate insulating film. A source electrode 17 is also provided on the surfaces of the p well regions 13a, and the source electrode 17 commonly contacts with the surfaces of both the n+ source regions 14 and the high-density contact regions 13b. A drain electrode 18 is provided at the reverse side of the n+ drain layer. Reference numeral 19 denotes an insulating film for protecting and stabilizing the surface, and the insulating film 19 is made of, for example, thermal oxidization film and phosphorous silica glass (PSG). In many cases, the source electrode 17 extends to the gate electrode layer 16 through interlayer insulating film 19A as shown in FIG. 1. A gate electrode of metal film is provided at a part (not shown) of each gate electrode layer 16. A drift electric current is passed through the n drift regions 12a, but the parallel pn layer including the p partition regions 12b will hereafter be referred to as the drift layer 12. The n drift regions 12a and the p partition regions may be arranged alternately with regard to the plane shape in the view from the surface of the substrate in stripes or arranged in other shapes such that one of either the n drift regions 12a or the partition regions 12b is in cross stripes and the other is surrounded thereby.

The n drift regions 12a are formed by, for example, epitaxial growth. The epitaxial growth causes the p partition regions 12 to fill the cavities formed in the n drift regions 12a. This is described in detail in Japanese Patent Application No. 10-209267.

For example, the standard size of each part and the impurity density of the MOSFET of the 400V-class take the following values. The specific resistance of the n+ drain layer 11 is 0.01 Ωcm and the thickness thereof is 350 µm; the thickness of the drift layer 12 is 32 µm; the width of the n drift regions 12a and the p partition regions 12b are 8 µm (i.e., the interval between the centers of the same regions is 16 µm); the impurity density in regions 12a and 12b is $3.0 \times 10^{15}$ cm$^{-3}$, the diffusion depth of the p well region 13a is 3 µm; the surface impurity density of region 13a is $2 \times 10^{17}$ cm$^{-3}$; the diffusion depth of the n+ source region 14 is 0.3 µm; and the surface impurity density of region 14 is $3 \times 10^{20}$ cm$^{-3}$.

For example, the standard size of each part and the impurity density of the MOSFET of the 800V-class take the following values. The specific resistance of the n+ drain layer 11 is 0.01 Ωcm and the thickness thereof is 350 µm; the thickness of the drift layer 12 is 48 µm; the width of the n drift regions 12a and the p partition regions 12b is 5 µm (i.e., the interval between the centers of the same regions is 10 µm); the impurity density of regions 12a and 12b is $3.5 \times 10^{15}$ cm$^{-3}$, the diffusion depth of the p well region 13a is 1 µm; the surface impurity density of regions 13b is $3 \times 10^{18}$ cm$^{-3}$; the diffusion depth of the n+ source region 14 is 0.3 µm; and the surface impurity density of region 14 is $1 \times 10^{20}$ cm$^{-3}$.

A description will now be given of the operation of the super-junction MOSFET in FIG. 3. When a predetermined positive voltage is applied to the gate electrode layer 16, the surface layer of the p well region 13a just below the gate electrode layer 16 induces an inversion layer, and electrons are implanted into an n channel region 13d from the n+ source region 14 through the inversion layer. The implanted electrons reach the n+ drain layer 11 via the drift region 12a, and therefore, the electricity is carried between the drain electrode 18 and the source electrode 17.

When the positive voltage is removed from the gate electrode layer 16, the inversion layer disappears from the surfaces of the p well regions 13a, and the electricity is shut off between the drain electrode 18 and the source electrode 17. If the reverse bias voltage is increased, depletion layers spread into the n drift regions 12a and the p partition regions 12b from pn junctions Ja between the p well regions 14a and the n-channel regions 12e and pn junctions Jb between the n drift regions 12a and the partition regions 12b, thereby depleting the n drift regions 12a and the p partition regions 12b.

The depletion ends from the pn junctions Jb spread along the width of the n drift regions 12a, and the depletion layers spread from the p partition regions 12b at both sides of the n drift regions 12a. Consequently, the n drift regions 12a are depleted very quickly, and this results in the increase in the impurity density of the n drift regions 12a.

The p partition regions 12b are depleted at the same time. The depletion layers spread into the p partition regions 12b from the junctions pn at both sides thereof, so that the p partition regions 12b can be depleted quickly. Since the p partition regions 12b and the n drift regions 12a are arranged alternately, the depletion ends spread from the p partition regions 12b into the adjacent n drift regions 12a. This reduces the total width of the p partition regions 12b forming the depletion layer by half, and this results in the increase in the sectional area of the n drift regions 12a.

In a second embodiment, an n-channel type MOSFET was simulated and manufactured by way of experiment under the following conditions: the quantity (dose) of boron impurities in the p partition regions 12b is fixed at $1 \times 10^{13}$ cm-2, and accordingly, the quantity (dose) of phosphorus impurities in the n drift regions 12a is variable within a range between 80% and 150%.

Figure 5:
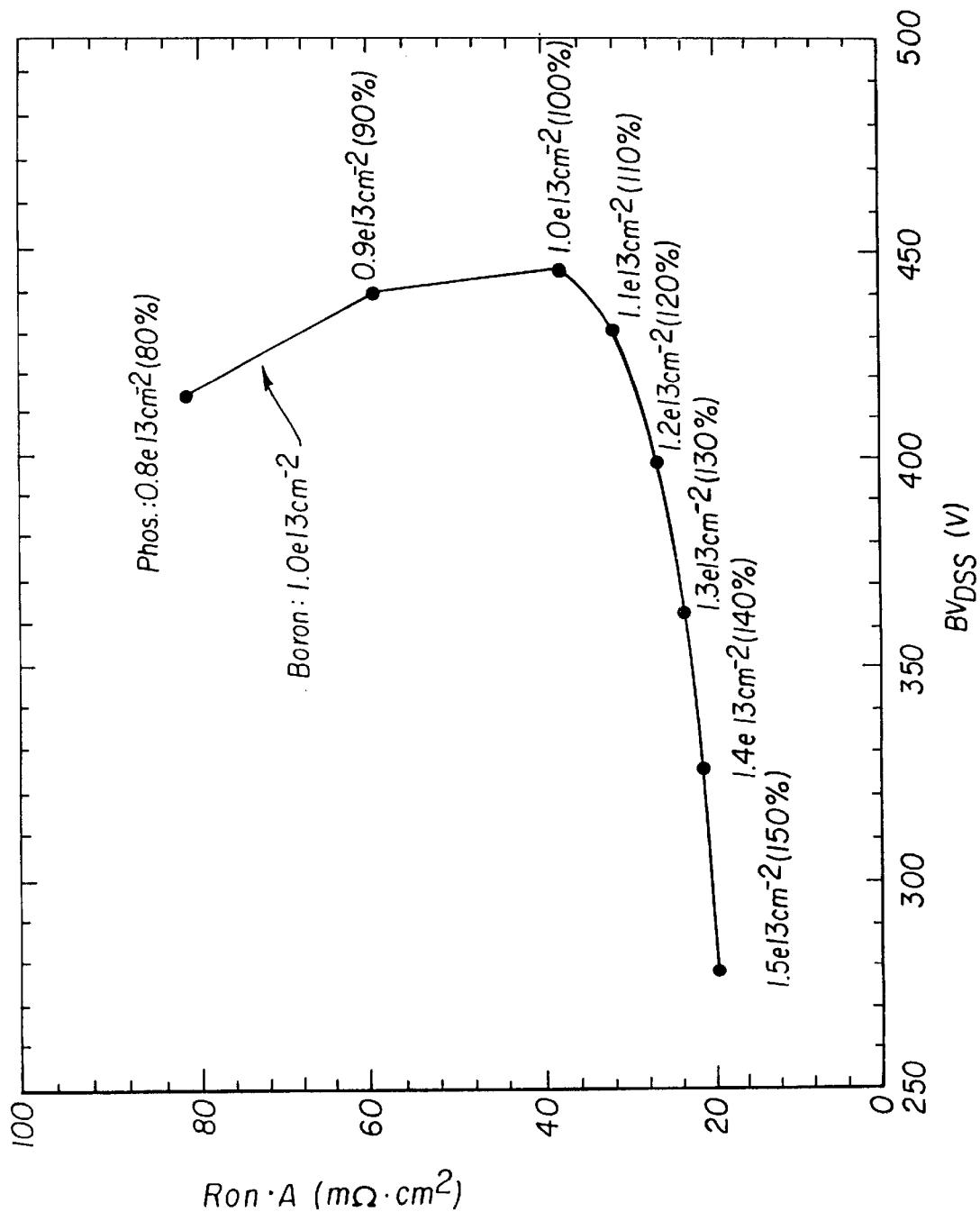
FIG. 5 is a characteristic drawing showing the dependency of the ON resistance (Ron•A) and the generated withstand voltage ($V_{DSS}$) on the quantity of impurities in a super-junction MOSFET according to the present invention.

FIG. 5 is a characteristic drawing showing the dependency of the ON resistance (Ron•A) and the withstand voltage ($V_{DSS}$) on the quantity of impurities. The horizontal axis represents the withstand voltage ($V_{DSS}$), and the vertical axis represents the ON resistance (Ron•A). The quantity (dose) of impurities in the p partition regions 12b is fixed at $1 \times 10^{13}$ cm$^{-2}$, and the width thereof is 8 µm. The depth of the drift layer is 32 µm.

For example, if the quantity of impurities in the n drift regions 12a is $1.0 \times 10^{13}$ cm$^{-2}$ (100%), the withstand voltage is 445V and the ON resistance is 38 mΩ·cm$^2$. If the quantity of impurities in the n drift regions 12a is $1.3 \times 10^{13}$ cm$^{-2}$ (130%), the withstand voltage is 365V and the ON resistance is 24 mΩ·cm$^2$. If the quantity of impurities in the n drift regions 12a is $1.5 \times 10^{13}$ cm$^{-2}$ (150%), the withstand voltage is 280V and the ON resistance is 20 mΩ·cm$^2$.

As is clear from FIG. 5, as the quantity of impurities in the n drift regions 12a is increased from 100% to 150% of the quantity of impurities in the p partition regions 12b, the withstand voltage ($V_{DSS}$) and the ON resistance (Ron•A) are lowered. Within the range between 100% and 150%, the ON resistance is little different between the products, and it is possible to consider only the unevenness of the withstand voltage in the mass production. It is therefore easy to manufacture the MOSFETs and manage the manufacturing process. This applies to every withstand voltage, although the MOSFET of the 400V class is adopted in this embodiment.

Figure 6:
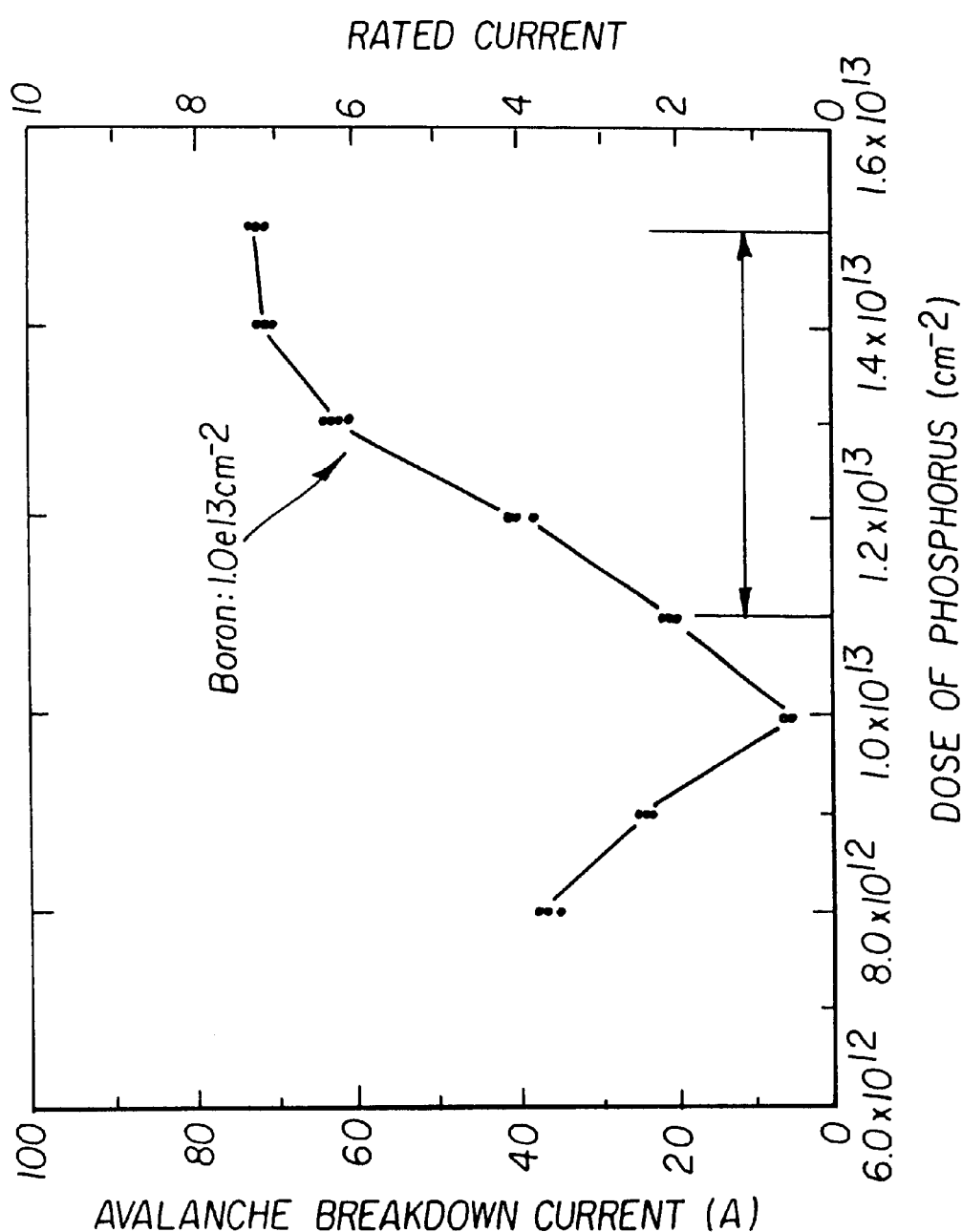
FIG. 6 is a characteristic drawing showing the dependency of the L load avalanche breakdown current (A) on the quantity of impurities.

FIG. 6 is a characteristic drawing showing the dependency of L load avalanche breakdown current on the quantity of impurities with respect to a third embodiment. The horizontal axis represents the quantity (dose) of boron impurities in the n drift regions 12a, and the vertical axis represents the L load avalanche breakdown current (A). The quantity (dose) of impurities in the p partition regions 12b is fixed at $1 \times 10^{13}$ cm$^{-2}$, and accordingly, the quantity (dose) of phosphorus impurities in the n drift regions 12a is variable within a range between 80% and 150%. The same conditions as in the first embodiment are established.

For example, if the quantity of impurities in the n drift regions 12a is $1.0 \times 10^{13}$ cm$^{-2}$ (100%), the avalanche breakdown current (A) is about 7A. If the quantity of impurities in the n drift regions 12a is $1.3 \times 10^{13}$ cm$^{-2}$ (130%), the avalanche breakdown current (A) is about 63A. If the quantity of impurities in the n drift regions 12a is $1.5 \times 10^{13}$ cm$^{-2}$ (150%), the avalanche breakdown current is about 72A.

As is clear from FIG. 6, if more than a rated current, preferably more than double the raged current of the L load avalanche breakdown current is required, the quantity (dose) of impurities in the n drift regions 12a should be more than 110%. If the quantity of impurities is more than 140%, the L load avalanche breakdown current tends to be saturated, and therefore, the quantity of impurities in the n drift regions 12a is preferably less than 150% in view of the decrease in the withstand voltage in FIG. 1. This applies to every withstand voltage.

The above-described experiments made clear the allowable range of the quantity of impurities in the n drift regions 12a and the p partition regions 12b of the parallel pn layer. If the super-junction semiconductor device is designed according to this range, the super-junction semiconductor devices with the high withstand voltage can be produced in large quantities while a trade-off relation between the ON resistance and the withstand voltage is significantly improved and a certain maximum avalanche breakdown current of the L load is guaranteed.

In a fourth embodiment, the n-channel type MOSFET was simulated and manufactured by way of experiment under the condition that the impurity density Cp of the p partition regions 12b is variable.

FIG. 1 is a characteristic drawing showing the dependency of the withstand voltage ($V_{DSS}$) on the impurity density Cp. The horizontal axis represents the impurity density Cp of the p partition regions 12b, and the vertical axis represents the withstand voltage ($V_{DSS}$). The impurity density Cn of the n drift regions 12a is fixed at $3.5 \times 10^{15}$ cm$^{-3}$, and the width of the p partition regions 12b and the n drift regions 12a is 5 µm. The depth of the drift layer 12 is 48 µm.

For example, if Cn=Cp=$3.5 \times 10^{15}$ cm$^{-3}$, the withstand voltage is 960V. If Cp=$3 \times 10^{15}$ cm$^{-3}$, the withstand voltage is about 750V. If Cp=$2 \times 10^{15}$ cm$^{-3}$, the withstand voltage is about 380V.

The withstand voltage is lowered as stated above since the n drift region 12a is not entirely depleted. If the impurity density of the p partition regions 12b is higher than that of the n drift regions 12a, the p partition regions 12b is not entirely depleted. Therefore, the withstand voltage is lowered, namely, the withstand voltage is lowered because both the drift regions 12a and the partition regions 12b are not entirely depleted.

As is clear from FIG. 6, if the impurity density Cp of the p partition regions 12b is about 8% above and below the impurity density Cn of the n drift regions 12a, the withstand voltage is lowered by only about 10%.

This applies to the case where the impurity density Cn of the n drift regions 12a is variable, although the impurity density Cp of the p partition regions 12b is variable in this embodiment. This may apply to every withstand voltage class with regard to withstand voltage classes.

In a fifth embodiment, the n-channel type MOSFET was simulated and manufactured by way of experiment under the following conditions: the width Ln of the n drift regions 12a is fixed and the width Lp of the p partition regions 12b is variable.

FIG. 1 is a characteristic drawing showing the dependency of the withstand voltage ($V_{DSS}$) on the size. The horizontal axis represents the width Lp of the p partition regions 12b, and the vertical axis represents the withstand voltage ($V_{DSS}$). The impurity density is fixed at $3.5 \times 10^{15}$ cm$^{-3}$, and the depth of the drift layer 12 is 48 $\mu$m.

For example, if Ln=Lp=5 $\mu$m, the withstand voltage is 960V, which is the maximum voltage. If Lp=4 $\mu$m, the withstand voltage is lowered to about 550V.

This results from the incomplete depletion of the n drift regions 12a If the p partition regions 12b is thicker than the n drift regions 12a, the p partition regions 12b is not completely depleted. Therefore, the withstand voltage is lowered.

As is clear from FIG. 1, if the width Lp of the p partition regions 12b is about 6% above and below the width Ln of the n drift regions 12a, the withstand voltage is lowered by only about 10%.

This applies to the case where the width Ln of the n drift regions 12a is variable, although the width Lp of the p partition regions 12b is variable in this embodiment. This also applies to every withstand voltage.

The above-described experiments made clear the allowable range of impurity density, size, etc. of the n drift regions 12a and the p partition regions 12b of the parallel pn layer. If the super-junction semiconductor device is designed according to this range, the super-junction semiconductor devices with the high withstand voltage can be produced in large quantities with a significant improvement in a trade-off relation between the ON resistance and the withstand voltage.

With regard to another method of manufacturing, a cavity for the impurities is partly formed before the epitaxial growth, and then, the epitaxial growth of the high-resistance layer is repeated several times in accordance with a sixth embodiment. Thereafter, the parallel pn layer is formed by thermal diffusion.

Figure 4:
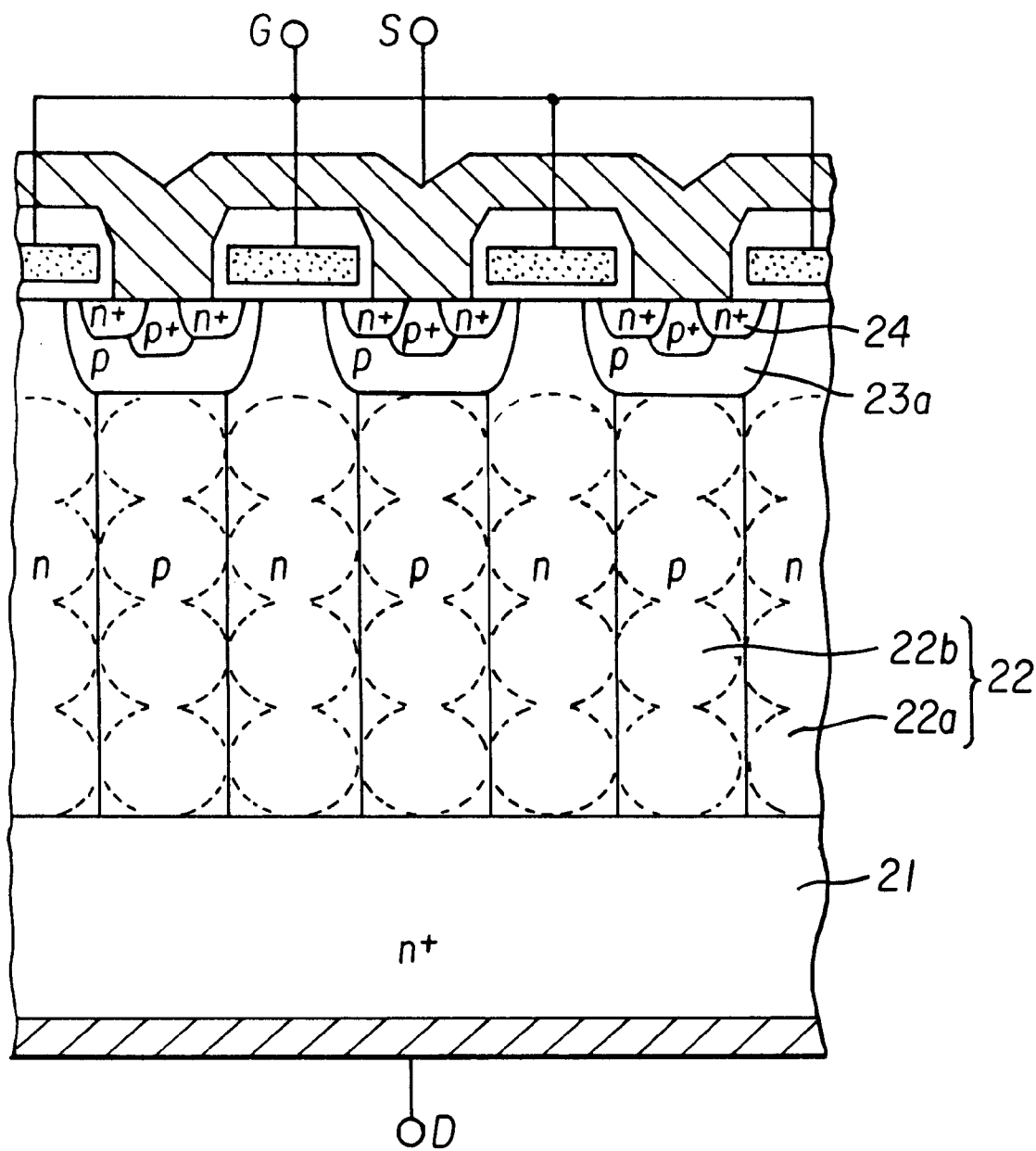
FIG. 4 is a partial sectional view showing the essential parts of a super-junction MOSFET according to the second embodiment.

FIG. 4 is a partial sectional view showing the essential parts of the longitudinal n-channel type super-junction MOSFET that is manufactured in this method.

FIG. 4 is different from FIG. 3 only in that the impurity density is uneven in the n drift regions 22b and the p partition regions 22b. To simplify the description, a dotted line indicates a line of the equal impurity density. The line of the equal impurity density is a curve (three-dimensionally, a curved surface) for the following reasons: the cavity for the impurities is formed before the epitaxial growth, the epitaxial growth of the high-resistance layer is repeated several times, and then the thermal treatment diffuses the high-resistance layer from the source of the impurities.

If the diffusion is performed for a sufficient period, a boundary between the n drift regions 22a and the p partition regions 22b is a straight line (three-dimensionally, a plane) as shown in FIG. 1.

In order to prevent the incomplete depletion of the n drift regions 22a and the p partition regions 22b, the quantity of impurities put in both regions should be almost equal.

Particularly, as stated previously, the utilization factor of the crystal plane of the semiconductor is optimized when the widths of the n drift regions 22a and the p partition regions 22b are equal. For this reason, the average impurity density of the n drift regions 22a and the p partition regions 22b should be almost equal.

As is the case with the third embodiment, if the quantity of impurities in either one of the first-conductivity-type drift region and the second-conductivity-type partition region is within the range between 92% and 108% of the quantity of impurities in the other region, the withstand voltage is only lowered by about 10%.

If the width is equal, the average impurity density of either one of the first-conductivity-type drift region and the second-conductivity-type partition region should be within the range between 92% and 108% of the average impurity density of the other region.

The width of either one of the conductive drift regions and the second-conductivity-type partition regions is within a range between 94% and 106% of the other regions.

The reduction in the width of the n drift regions 12a and the p partition region 12b and the increase in the impurity density thereof would result in the decrease in the ON resistance and the improvement in the trade-off relation between the ON resistance and the withstand voltage.

The longitudinal MOSFET is used in the above embodiments, but it is also possible to use a lateral semiconductor device, in which the drift electric current flows in a different direction from a direction in which a depletion layer is extended by the reverse bias while in an off state. Moreover, an IGBT, a pn diode, a schottky barrier diode and a bipolar transistor can also achieve the same effects.

As set forth hereinabove, in the super-junction semiconductor device having the parallel pn layer, in which the first-conductivity-type drift regions and the second-conductivity-type partition regions are arranged alternately and which conducts electricity in the ON state and is depleted in the OFF state; the allowable ranges of the impurity density, size, or the like of the first-conductivity-type drift regions and the second-conductivity-type partition regions are specified in order to significantly improve the trade-off relation between the ON-resistance and the withstand voltage, achieve a high withstand voltage, guarantee a certain maximum avalanche breakdown current of the L load and enable the mass production of the super-junction semiconductor devices with the high withstand voltage.

It should be understood, however, that there is no intention to limit the invention to the specific forms disclosed, but on the contrary, the invention is to cover all modifications, alternate constructions and equivalents falling within the spirit and scope of the invention as expressed in the appended claims.

What is claimed is:

1. A super-junction semiconductor device comprising:
   first and second principal faces;
   first and second principal electrodes provided on at least one of said first and second principal faces; and
   a parallel pn layer, in which first-conductivity-type drift regions and second-conductivity-type partition regions are arranged alternately, said parallel pn layer being provided between the first and second principal faces of a substrate;
   wherein the quantity of impurities in said first-conductivity-type drift regions is greater than the quantity of impurities in said second-conductivity-type partition regions.

2. A super-junction semiconductor device as claimed in claim 1, wherein the quantity of impurities in said firstconductivity-type drift regions is within the range between 110% and 150% of the quantity of impurities in said second-conductivity-type partition regions.

3. The super-junction semiconductor device as defined in claim 1, wherein both said conductive drift regions and said second-conductivity-type partition regions are arranged in stripes.

4. The super-junction semiconductor device as defined in claim 2, wherein both said conductive drift regions and said second-conductivity-type partition regions are arranged in stripes.

5. The super-junction semiconductor device as defined in claim 1, wherein said first and second principal electrodes are respectively provided on said first and second principal faces.

6. The super-junction semiconductor device as defined in claim 2, wherein said first and second principal electrodes are respectively provided on said first and second principal faces.

* * * * *